United States Patent
Lee et al.

(10) Patent No.: US 8,633,748 B2
(45) Date of Patent: Jan. 21, 2014

(54) FILTERING CIRCUIT AND SEMICONDUCTOR INTEGRATED CIRCUIT HAVING THE SAME

(75) Inventors: Hye-Young Lee, Gyeonggi-do (KR); Yong-Mi Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 127 days.

(21) Appl. No.: 13/302,167

(22) Filed: Nov. 22, 2011

(65) Prior Publication Data

US 2013/0082755 A1  Apr. 4, 2013

(30) Foreign Application Priority Data

Oct. 4, 2011  (KR) .................. 10-2011-0100851

(51) Int. Cl.
*H03L 7/06* (2006.01)

(52) U.S. Cl.
USPC .................................. 327/158; 327/149

(58) Field of Classification Search
USPC ................................. 327/149, 158
See application file for complete search history.

(56) References Cited

U.S. PATENT DOCUMENTS

| 3,777,272 | A | * | 12/1973 | Fletcher et al. | 327/156 |
| 4,442,464 | A | * | 4/1984 | Ito | 360/72.1 |
| 5,479,126 | A | * | 12/1995 | Pan et al. | 327/157 |
| 6,087,868 | A | | 7/2000 | Millar | |
| 6,337,590 | B1 | | 1/2002 | Millar | |
| 7,366,270 | B2 | | 4/2008 | Tang et al. | |
| 7,911,873 | B1 | | 3/2011 | Menon et al. | |
| 8,339,120 | B2 | * | 12/2012 | Higashino | 324/76.77 |
| 2005/0220241 | A1 | * | 10/2005 | Zhang et al. | 375/376 |
| 2011/0080199 | A1 | * | 4/2011 | Yen et al. | 327/157 |
| 2011/0128054 | A1 | * | 6/2011 | Kerkman et al. | 327/156 |
| 2012/0109356 | A1 | * | 5/2012 | Kong et al. | 700/121 |
| 2012/0302192 | A1 | * | 11/2012 | Seendripu et al. | 455/314 |
| 2012/0302193 | A1 | * | 11/2012 | Seendripu et al. | 455/314 |
| 2013/0063191 | A1 | * | 3/2013 | Patil et al. | 327/156 |
| 2013/0082755 | A1 | * | 4/2013 | Lee et al. | 327/158 |
| 2013/0122847 | A1 | * | 5/2013 | Seendripu et al. | 455/317 |
| 2013/0181756 | A1 | * | 7/2013 | Ballantyne et al. | 327/157 |

FOREIGN PATENT DOCUMENTS

KR  100500925  7/2005

* cited by examiner

*Primary Examiner* — Adam Houston
(74) *Attorney, Agent, or Firm* — IP & T Group LLP

(57) ABSTRACT

A filtering circuit includes jitter determination reference control unit configured to determine a jitter determination reference in correspondence to an operation mode and output a control signal in response to the jitter determination reference, and a filtering unit configured to set the jitter determination reference in response to the control signal and determine whether an input signal is maintained during a sample period in response to the set jitter determination reference.

18 Claims, 8 Drawing Sheets

FILTERING CIRCUIT AND SEMICONDUCTOR INTEGRATED CIRCUIT HAVING THE SAME

CROSS-REFERENCE TO RELATED APPLICATIONS

The present application claims priority of Korean Patent Application No. 10-2011-0100851, filed on Oct. 4, 2011, which is incorporated herein by reference in its entirety.

BACKGROUND

1. Field

Exemplary embodiments of the present invention relate to semiconductor integrated circuit, and more particularly, to a semiconductor integrated circuit including a filtering circuit.

2. Description of the Related Art

In general, a semiconductor memory device such as double data rate synchronous DRAM (DDR SDRAM) includes a delay locked loop (DLL) that is configured to compensate for time delay caused by an internal circuit such that an internal clock signal and an external clock signal have the same phase, when the external clock signal inputted from a circuit outside of the semiconductor memory device is used inside the semiconductor memory device. In other words, the DLL receives the external clock signal and compensates for a delay component in an actual clock path and data path to previously reflect negative delay. Accordingly, data outputted from the semiconductor memory device may be synchronized with the external clock signal.

FIG. 1 is a block diagram of a conventional DLL.

Referring to FIG. 1, the DLL 100 includes an input buffer unit 110, a variable delay line 120, a replica delay 130, a phase comparator 140, a filtering unit 150, a delay control unit 160, an output driver 170, and a data output unit 180. The input buffer unit 110 is configured to buffer an external clock signal EXTCLK and output an internal clock signal INTCLK. The variable delay line 120 is configured to delay the internal clock signal INTCLK by a delay time required for locking in response to a delay control signal DELYCTL, and output a delay locked clock signal DLLCLK. The replica delay 130 is configured to delay the delay locked clock signal DLLCLK by a delay time occurring in an actual clock path and data path and output a feedback clock signal FBCLK. The phase comparator 140 is configured to compare the phase of the internal clock signal INTCLK with of the phase of the feedback clock signal FBCLK. The filtering unit 150 is configured to generate filtered comparison signals INC and DEC in response to a comparison signal PDOUT outputted from the phase comparator 140 and a control clock signal CTRLCLK. The delay control unit 160 is configured to generate a delay control signal DELYCTRL in response to the filtered comparison signals INC and DEC. The output driver 170 is configured to drive the delay locked clock signal DLLCLK. The data output unit 180 is configured to output data signals RDATA and FDATA to a data pad DQ in synchronization with a delay locked clock signal DLLCLK' driven by the output driver 170.

FIG. 2 is an internal configuration diagram of the filtering unit 150 illustrated in FIG. 1.

Referring to FIG. 2, the filtering unit 150 includes a sampling unit 152 and output sections 154A and 154B. The sampling unit 152 is configured to sample the comparison signal PDOUT in synchronization with the control clock signal CTLCLK, and the output sections 154A and 154B are configured to output filtered first and second comparison signals INC and DEC in response to output signals A to E of the sampling unit 152.

The sampling unit 152 successively shifts the comparison signal PDOUT by a designated sampling number (for example, five) and outputs successively-shifted comparison signals A to E. The sampling unit 152 may include D flip-flop chains DFF0 to DFF4.

Furthermore, the output sections 154A and 154B include a first output unit 154A configured to perform an AND operation on the shifted comparison signals A to E and output a filtered first comparison signal INC, and a second output unit 154B configured to perform a NOR operation on the shifted comparison signals A to E and output a filtered second comparison signal DEC. For example, the first output unit 154A may include an NAND gate NAND configured to perform an NAND operation on the shifted comparison signals A to E and an inverter INV configured to invert an output signal of the NAND gate NAND, and the second output unit 154B may include a NOR gate NOR configured to perform a NOR operation on the shifted comparison signals A to E.

Hereafter, the operation of the DLL 100 configured in such a manner will be described.

During initial driving, when an external clock signal EXTCLK is buffered by the input buffer unit 110 and transmitted as an internal clock signal INTCLK to the variable delay line 120, the variable delay line 120 bypasses the internal clock signal INTCLK.

The replica delay 130 receives a delay locked clock signal DLLCLK outputted from the variable delay line 120, delays the received signal by a modeled delay time, and outputs a feedback clock signal FBCLK to the phase comparator 140.

The phase comparator 140 compares the phase of the internal clock signal INTCLK outputted from the input buffer unit 110 with the phase of the feedback clock signal FBCLK outputted from the replica delay 130 and transmits a comparison signal PDOUT corresponding to the comparison result to the filtering unit 150.

The filtering unit 150 filters the comparison signal PDOUT and outputs filtered comparison signals INC and DEC. In the filtering unit 150, the filtering is performed to determine whether the comparison signal PDOUT is a jitter or not. During the filtering, the comparison signal PDOUT is sampled by a designated sampling number (for example, five) to determine whether the comparison signal PDOUT is a jitter or not. FIG. 3 shows the filtering operation. Referring to FIG. 3, when all of the signals A to E obtained by successively shifting the comparison signal PDOUT have a logic high level, the filtered first comparison signal INC is activated to a logic high level. In other words, when the sampling results A to E obtained by sampling the comparison signal PDOUT five times have the same value, the comparison signal PDOUT is determined to be a normal comparison signal, and the filtered first or second comparison signal INC and DEC is activated. On the other hand, when any one of the sampling results A to B has a different value, the comparison signal PDOUT is determined to an abnormal comparison signal, more specifically, a jitter, and the filtered first and second comparison signal INC and DEC are not activated. As a result, the filtering unit 150 activates the filtered first or second comparison signal INC and DEC only when the comparison signal PDOUT continuously has a constant logic level during five periods (5tCK) of the control clock signal CTRCLK.

The delay control unit 160 generates a delay control signal DELYCTRL according to the filtered first and second comparison signals INC and DEC outputted from the filtering unit 150, and outputs the generated signal to the variable delay line 120. Here, when the filtered first comparison signal INC is activated, the delay control unit 160 outputs a delay control signal DELYCTRL for increasing the delay time of the variable delay line 120. On the other hand, when the filtered second comparison signal DEC is activated, the delay control unit 160 outputs a delay control signal DELYCTRL for decreasing the delay time of the variable delay line 120.

The variable delay line 120 delays the internal clock signal INTCLK by a designated delay time in response to the delay control signal DELYCTRL, and outputs the delay locked clock signal DLLCLK.

When the above-described series of operations are repeated and the phases of the internal clock signal INTCLK and the feedback clock signal FBCLK are synchronized according to the comparison result of the phase comparator 140, the delay time of the variable delay line 120 is delay locked.

Meanwhile, after the delay time required for locking the variable delay line 120 is decided, an update process is performed every designated period. The update process is repetitively performs the above-described locking process to adaptively deal with an environment change. The locking process is referred to as a tracking process. When the update process is performed, a jitter may occur. In this case, since the jitter is filtered, the update process is not incorrectly performed. When the update process is performed by a jitter, a jitter caused by the update process is added to the occurring jitter, and thus a jitter of the final output further increases. For reference, the above-described jitter includes a voltage jitter and a clock jitter. The voltage jitter component may be caused by a defect of an external power supply device, a coupling of voltage transmission lines, and a voltage drop by an internal operation of the DRAM (not illustrated) including the DLL 100, and the clock jitter may be caused by a defect of an external clock supply device and a coupling of clock transmission lines.

According to the above-described DLL 100, the wrong update process by the jitter is not performed.

However, the DLL 100 may have the following features.

As described above, the filtering unit 150 performs a function of filtering the comparison signal PDOUT outputted from the phase comparator 140. More specifically, when the comparison signal PDOUT is activated, the filtering unit 150 determines whether the comparison signal PDOUT is a normal comparison signal for tracking or an abnormal comparison signal caused by a jitter. As a determination result, when the comparison signal PDOUT is an abnormal comparison signal, the filtering unit 150 ignores the comparison signal PDOUT, and when the comparison signal PDOUT is a normal comparison signal, the filtering unit 150 activates the filtered comparison signals INC and DEC. At this time, the determination method may include a process of sampling the comparison signal PDOUT by a designated sampling number (for example, five). For example, sampling may include whether the activation unit of the comparison signal PDOUT is maintained during five periods (5tCK) of the control clock signal CTRLCLK or not. However, since the sampling number is fixed when the filtering unit 150 performs a filtering operation, a situation handling ability may decrease. When the sampling number is increased to improve the jitter determination ability, the tracking period (or update period) is lengthened, thereby increasing a time required for tracking the delay locked clock signal DLLCLK. On the other hand, when the sampling number is decreased to reduce the tracking period (or update period), the jitter determination ability decreases. For reference, when the tracking period (or update period) is lengthened, a quick tracking operation is not performed where a situation such as 'voltage bump' occurs, and thus a malfunction becomes severe. The voltage bump may include when an unintended voltage drop occurs or when a voltage drop is intentionally caused for power reduction.

Therefore, a sampling number should be suitable for all situations. However, since an optimal sampling number differs depending on situations, a common optimal sampling number may be difficult to decide.

SUMMARY

An embodiment of the present invention is directed to a filtering circuit with a sampling number optimized for each operation mode and a semiconductor integrated circuit having the same.

In accordance with an embodiment of the present invention, a filtering circuit includes: a jitter determination reference control unit configured to determine a jitter determination reference in correspondence to an operation mode and output a control signal in response to jitter determination reference; and a filtering unit configured to set the jitter determination reference in response to the control signal and determine whether an input signal is maintained during a sample period in response to the set jitter determination reference.

In accordance with another embodiment of the present invention, a semiconductor integrated circuit includes: a variable delay line configured to delay a source clock signal by a delay time for locking in response to a first control signal and output a delay locked clock signal; a replica delay unit configured to delay the delay locked clock signal by a delay time occurring in a clock path and output a feedback clock signal; a phase comparator configured to compare phases of the source clock signal and the feedback clock signal and output a comparison signal; a filtering circuit configured to determine whether the comparison signal is maintained during a sample period in response to a jitter determination reference that corresponds to an operation mode; and a first control unit configured to generate the first control signal in response to the comparison signal filtered by the filtering circuit.

DETAILED DESCRIPTION

Figure 1:
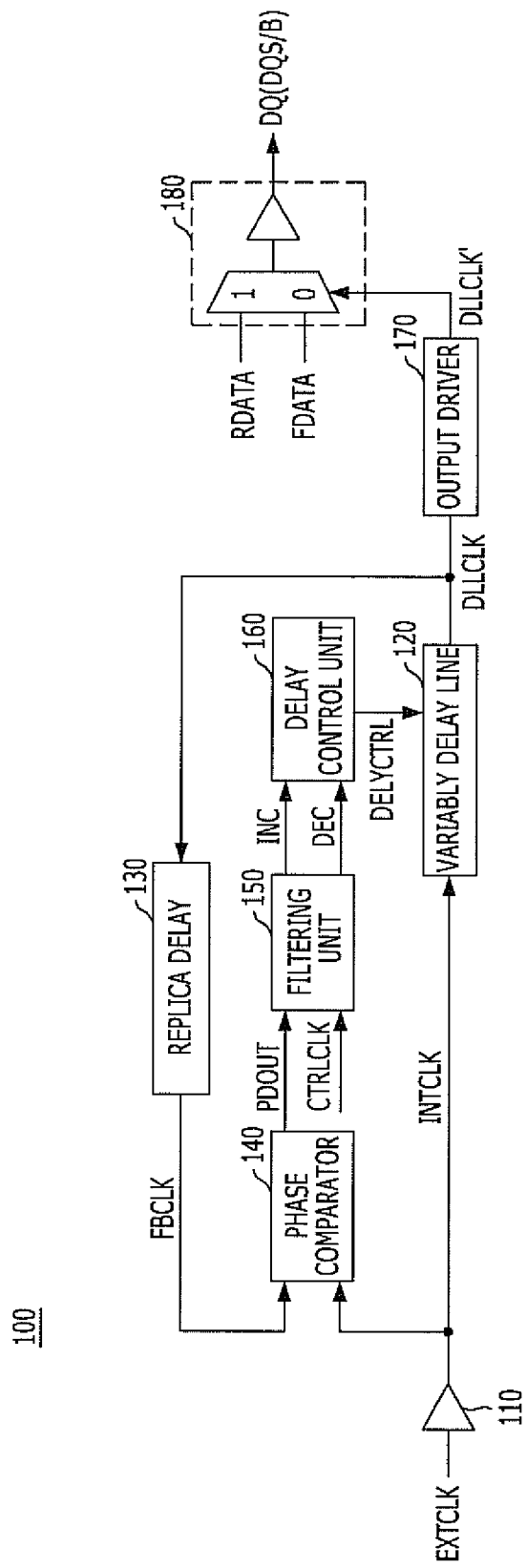
FIG. 1 is a block diagram of a conventional DLL.
Figure 2:
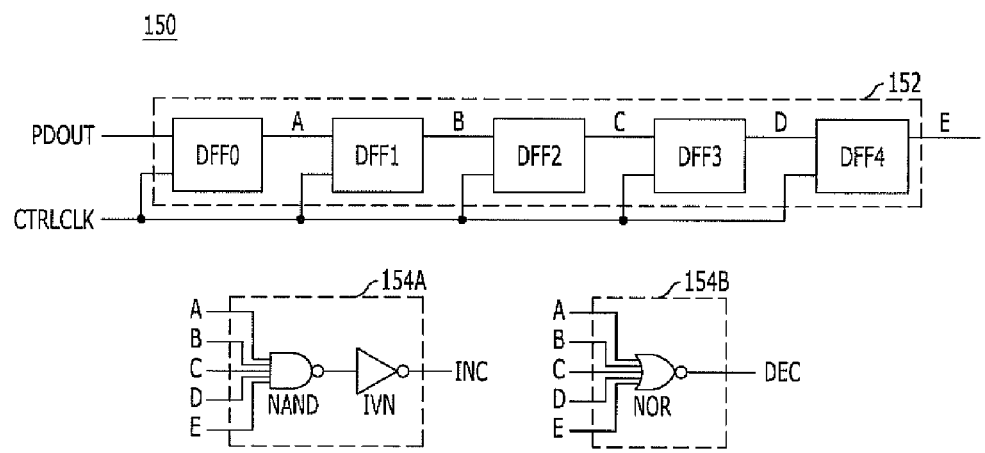
FIG. 2 is an internal configuration diagram of a filtering unit illustrated in FIG. 1.
Figure 3:
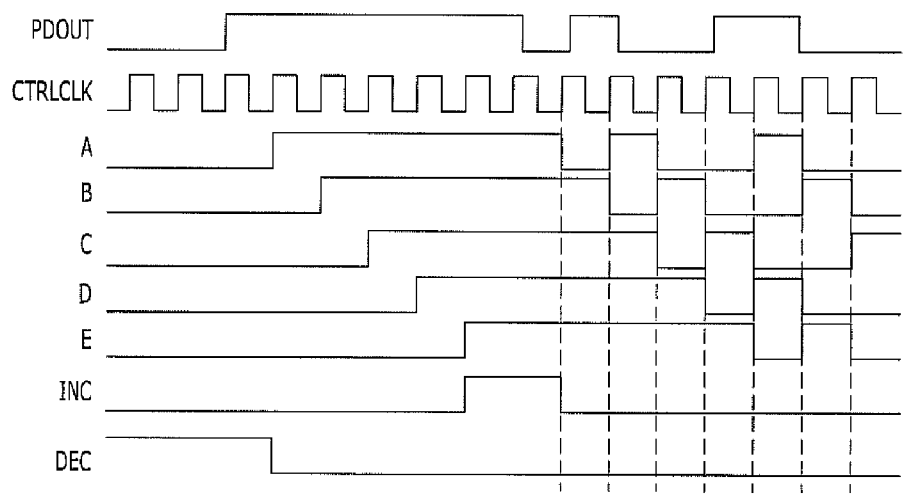
FIG. 3 is a timing diagram illustrating an operation of the filtering unit illustrated in FIG. 2.

Exemplary embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

Figure 4:
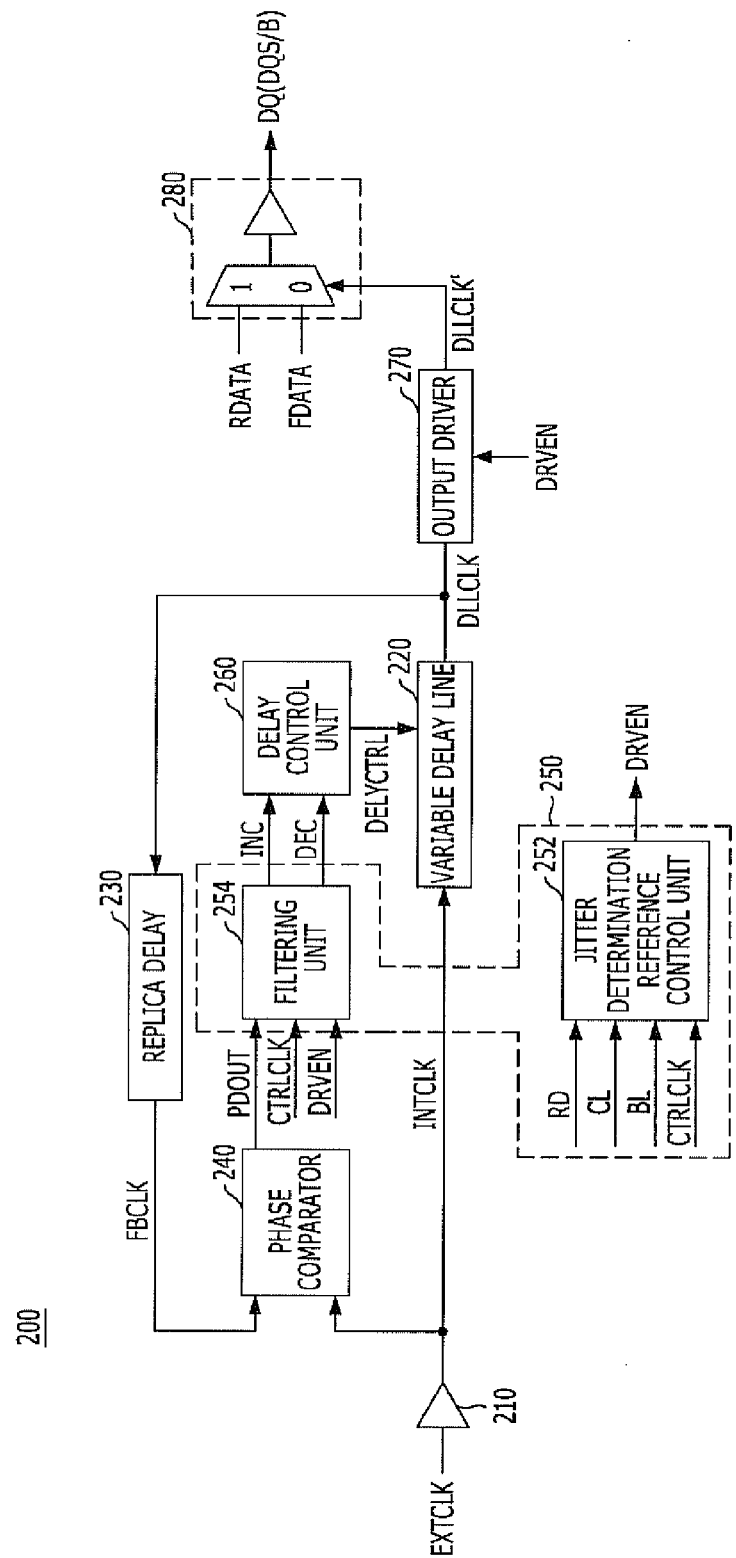
FIG. 4 is a block diagram of a filtering circuit in accordance with an embodiment of the present invention.

FIG. 4 is a block diagram of a filtering circuit in accordance with an embodiment of the present invention.

In the embodiment of the present invention, a DLL will be taken as an example for description.

Referring to FIG. 4, the DLL 200 includes an input buffer unit 210, a variable delay line 220, a replica delay 230, a phase comparator 240, a filtering circuit 250, a delay control unit 260, an output driver 270, and a data output unit 280. The input buffer unit 210 is configured to buffer an external clock signal EXTCLK applied from a circuit outside of the DLL 200 and generate an internal clock signal INTCLK. The variable delay line 220 is configured to delay the internal clock signal INTCLK by a delay time for locking in response to a delay control signal DELYCTRL and output a delay locked clock signal DLLCLK. The replica delay 230 is configured to delay the delay locked clock signal DLLCLK by a delay time occurring in an actual clock path and data path and output a feedback clock signal FBCLK. The phase comparator 240 is configured to compare the phase of the internal clock signal INTCLK and the phase of feedback clock signal FBCLK. The filtering circuit 250 is configured to filter a comparison signal PDOUT outputted from the phase comparator 240 in response to a jitter determination reference for each operation mode. The delay control unit 260 is configured to generate a delay control signal DELYCTRL in response to filtered comparison signals INC and DEC by the filtering circuit 250. The output driver 270 is configured to selectively output the delay locked clock signal DLLCLK in response to a jitter determination reference control signal DRVEN outputted from the filtering circuit 250. The data output unit 280 is configured to output data signals RDATA and FDATA to a data pad DQ in synchronization with a delay locked clock signal DLLCLK' outputted from the output driver 270.

Here, the delay time occurring in the actual clock path and data path is referred to as a modeled delay time. The delay time may be defined by the sum of a delay time occurring in the path until the external clock signal EXTCLK is inputted through a pad (not illustrated) to generate the internal clock signal INTCLK and a delay time occurring in the path until the delay locked clock signal DLLCLK is generated to output the data RDATA and FDATA to a circuit outside of the DLL 200 through the data pad DQ.

The filtering circuit 250 includes a jitter determination reference control unit 252 and a filtering unit 254. The jitter determination reference control unit 252 is configured to determine the jitter determination reference in response to an operation mode. The filtering unit 254 is configured to set the jitter determination reference in response to the jitter determination reference control signal DRVEN outputted from the jitter determination reference control unit 252, and filter the comparison signal PDOUT in response to the set jitter determination reference. The jitter determination reference is a parameter for determining whether the activated comparison signal PDOUT was generated by a jitter or not, and corresponds to a sampling number, which will be described below in detail.

Figure 5:
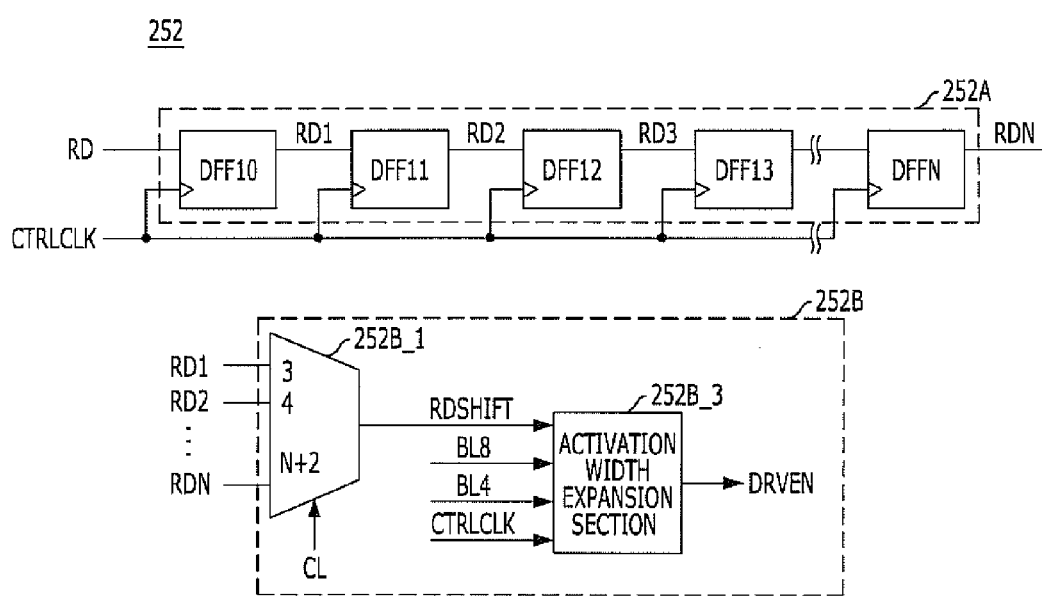
FIG. 5 is an internal configuration diagram of a jitter determination reference control unit of FIG. 4.
Figure 6:
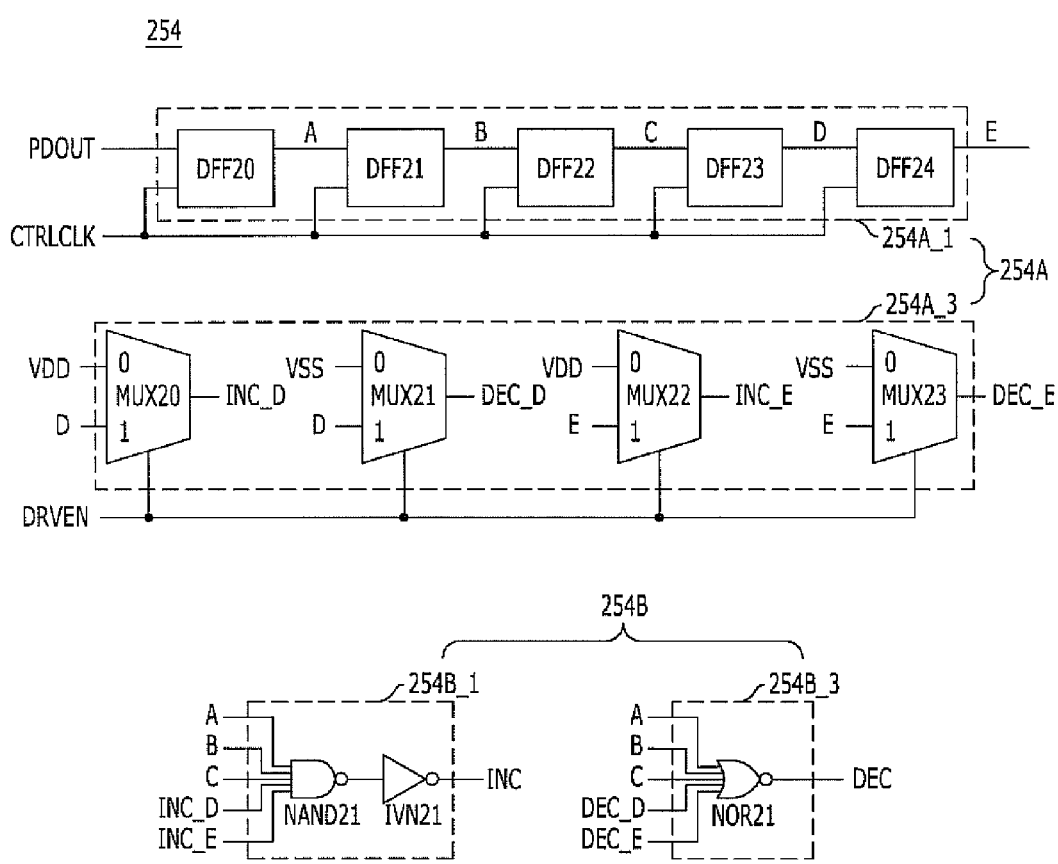
FIG. 6 is an internal configuration diagram of a filtering unit of FIG. 4.

FIG. 5 is an internal configuration diagram of the jitter determination reference control unit 252. FIG. 6 is an internal configuration diagram of the filtering unit 254.

Referring to FIG. 5, the jitter determination reference control unit 252 includes a first shifting unit 252A and a control signal generation unit 252B. The first shifting unit 252A is configured to generate a plurality of shifted read commands RD1 to RDN in response to a read command RD and a control clock signal CTRLCLK. The control signal generation unit 252B is configured to generate the jitter determination reference control signal DRVEN in response to the plurality of shifted read commands RD1 to RDN, the control clock signal CTRLCLK, CAS latency information CL, burst length information BL4 and BL8. Here, the control clock signal CTRLCLK may include the internal clock signal INTCLK and a clock signal obtained by processing the external clock signal EXTCLK according to the internal environment and operation performance.

The first shifting unit 252A includes D flip-flop chains DFF10 to DFFN configured to successively shift a read command RD in response to the control clock signal CTRLCLK.

The control signal generation unit 252B includes a selection unit 252B_1 and an activation width expansion 252B_3. The selection unit 252B_1 is configured to select any one of the plurality of shifted read commands RD1 to RDN in response to the CAS latency information CL. The activation width expansion unit 252B_3 is configured to expand the activation width of the shifted read command RDSHIFT selected by the selection unit 252B_1 and output the expanded signal as the jitter determination reference control signal DRVEN in response to the burst length information BL4 and BL8 and the control clock signal CTRLCLK. For example, the activation width expansion unit 252B_3 may expand the activation width of a read command RD by two periods (2tCK) or four periods (4tCK) of the control clock signal CTRLCLK according to the burst length information BL4 and BL8.

The jitter determination reference control unit 252 configured as described above activates the jitter determination reference control signal DRVEN during a designated period in a read operation mode.

Referring to FIG. 6, the filtering unit 254 includes a sampling unit 254A and a jitter determination unit 254B. The sampling unit 254A is configured to sample the comparison signal PDOUT by a sampling number corresponding to the jitter determination reference for each operation mode in response to the jitter determination reference control signal DRVEN. The jitter determination unit 254B is configured to determine whether the comparison signal PDOUT is a jitter or not according to output signals A, B, C, INC_D, INC_E, DECD, and DEC_E of the sampling unit 254A and generate filtered comparison signals INC and DEC. For example, the sampling number is higher in the read operation mode than in other operation modes. For example, the sampling number is set to five in the read operation mode, and the sampling number is set to three in operation modes other than the read operation mode. Whether the pulse width of the activated comparison signal PDOUT is maintained during five periods (5tCK) of the control clock signal CTRCLK or not is sampled in the read operation mode, and whether the pulse width of the activated comparison signal PDOUT is maintained during three periods (3tCK) of the control clock signal CTRLCLK or not is sampled in operation modes other than the read operation mode. Therefore, during the read operation mode, the jitter determination reference may be set to a longer period to perform a stable operation. On the other hand, during operation modes other than the read operation mode, the jitter determination reference may be set to a shorter period to advance a tracking period (or update period) of the DLL 200.

The sampling unit 254A includes a second shifting unit 254A_1 and a blocking unit 254A_3. The second shifting unit 254A_1 is configured to generate first to fifth shifted comparison signals A to E that are sequentially outputted in response to the comparison signal PDOUT and the control clock signal CTRLCLK. The blocking unit 254A_3 is configured to selectively block the comparison signals D and E that are outputted among the first to fifth shifted comparison signals A to E in response to the jitter determination reference control signal DRVEN. The second shifting unit 254A_1 includes D flip-flop chains DFF20 to DFF24 configured to successively shift the comparison signal PDOUT in response to the control clock signal CTRLCLK. The blocking unit 254A_3 includes first to fourth multiplexers MUX20 to MUX23 configured to selectively output any one of the comparison signals D and E, which are outputted in response to the jitter determination reference control signal DRVEN, and blocking signals VDD and VSS fixed at a designated voltage level. The first multiplexer MUX20 is configured to selectively output any one of the power supply voltage VDD and the fourth shifted comparison signal D in response to the jitter determination reference control signal DRVEN, the second multiplexer MUX21 is configured to selectively output any one of the ground voltage VSS and the fourth shifted comparison signal D in response to the jitter determination reference control signal DRVEN, the third multiplexer MUX22 is configured to selectively output any one of the power supply voltage VDD and the fifth shifted comparison signal E in response to the jitter determination reference control signal DRVEN, and the fourth multiplexer MUX23 is configured to selectively output any one of the ground voltage VSS and the fifth shifted comparison signal E in response to the jitter determination reference control signal DRVEN.

The jitter determination unit 254B performs a logical operation on the comparison signals A to C and first to fourth output signals INC_D, INC_E, DEC_D, and DEC_E of the blocking unit 254A_3, and outputs the filtered comparison signals INC and DEC. The jitter determination unit 254B includes a first determination unit 254B_1 configured to output the first filtered comparison signal INC and a second determination unit 254B_3 configured to output the second filtered comparison signal DEC. The first determination unit 254B_1 includes a NAND gate NAND21 and an inverter NV21. The NAND gate NAND 21 is configured to perform a NAND operation on the first to third shifted comparison signals A to C and the output signals INC_D and INC_E of the first and third multiplexers MUX20 and MUX22, and the inverter NV21 is configured to invert an output signal of the NAND gate NAND21 and output a first filtered comparison signal INC. The second determination unit 254B_3 includes a NOR gate NOR21 configured to perform a NOR operation on the first to third shifted comparison signals A to C and the output signals DEC_D and DEC_E of the second and fourth multiplexers MUX21 and MUX23 and output a second filtered comparison signal DEC. Here, the first filtered comparison signal INC is used as a source signal for increasing the delay time of the variable delay line 220. On the other hand, the second filtered comparison signal DEC is used as a source signal for decreasing the delay time of the variable delay line 220.

Hereafter, the operation of the DLL 200 in accordance with the embodiment of the present invention will be described with reference to FIGS. 7 to 9.

At this time, the following descriptions will be focused on the operation of the filtering circuit 250.

Figure 7:
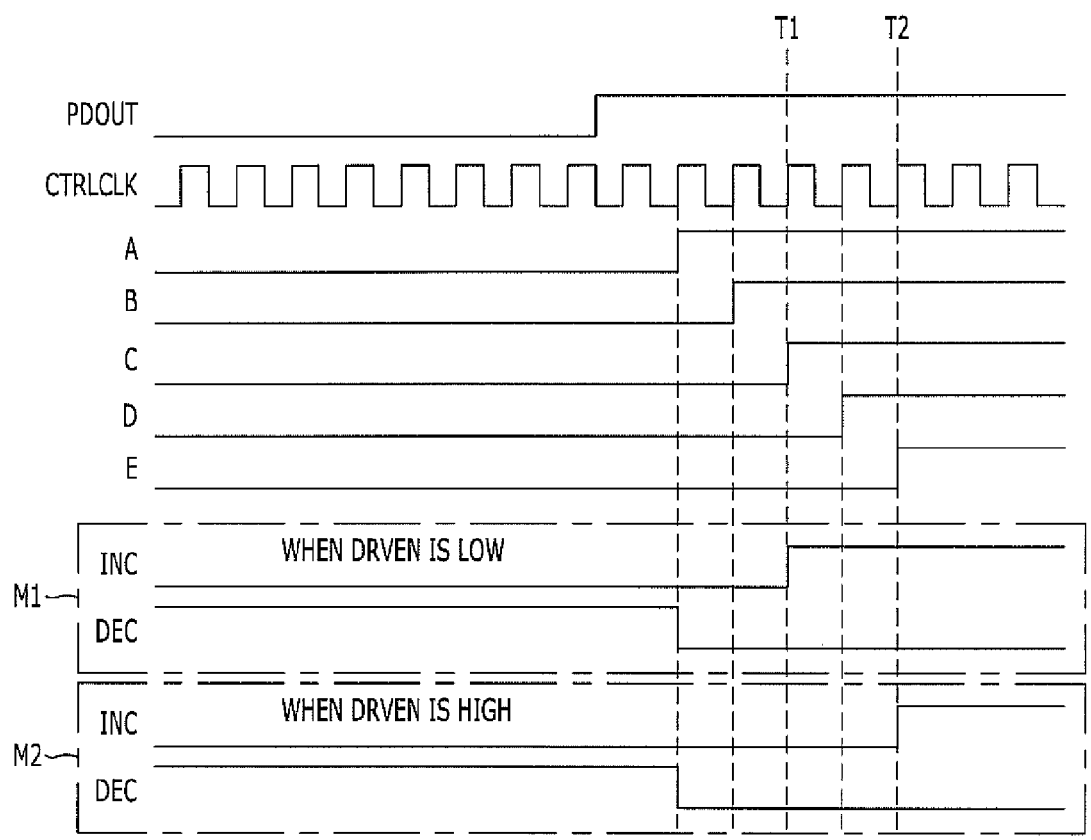
FIGS. 7 and 8 are timing diagrams illustrating the operation of the filtering circuit illustrated in FIGS. 4 to 6.

FIG. 7 is a timing diagram illustrating the operation of the filtering circuit 250 in each operation mode, when the comparison signal PDOUT is normally activated.

First, the operation in operation modes M1 except the read operation mode M2 will be described.

Referring to FIG. 7, the jitter determination reference control unit 252 outputs the jitter determination reference control signal DRVEN at a logic low level because a read command RD is not activated.

In such a state, when the comparison signal PDOUT is activated at a logic high level, the sampling unit 254A samples the comparison signal PDOUT three times, and the jitter determination unit 254B activates the filtered comparison signal INC to a logic high level at a time point T1 when the third period (3tCK) of the control clock signal CTRLCLK begins after the comparison signal PDOUT is activated according to the sampling result of the sampling unit 254A. The sampling operation may be described more specifically as follows. The second shifting unit 254A_1 successively shifts the comparison signal PDOUT in synchronization with the control clock signal CTRLCLK and generates the first to fifth shifted comparison signals A to E. At this time, the blocking unit 254A_3 fixes the fourth and fifth shifted comparison signals D and E to designated voltage levels VDD and VSS in response to the jitter determination reference control signal DRVEN at a logic low level. Accordingly, when the first to third shifted comparison signals A to C are at a logic high level, the jitter determination unit 254B activates the filtered comparison signals INC and DEC regardless of the fourth and fifth shifted comparison signals D and E.

As a result, since the jitter determination reference control signal DRVEN is deactivated to a logic low level in other operation modes M1 except the read operation mode M2, the jitter determination reference is set to three periods (3tCK) of the control clock signal CTRLCLK. When the activation state of the comparison signal PDOUT is maintained for three periods (3tCK) of the control clock signal CTRLCLK, the comparison signal PDOUT is recognized as a normal comparison signal.

Therefore, as the sampling number is set to three in operation modes M1 other than the read operation mode M2, the tracking period (or update period) may be shorter in time during the tracking operation of the DLL 200.

Next, the operation in the read operation mode M2 will be described.

Referring to FIG. 7, the jitter determination reference control unit 252 outputs the jitter determination reference control signal DRVEN at a logic high level because the read command RD is activated. More specifically, the first shifting unit 252A successively shifts the read command RD in synchronization with the control clock signal CTRLCLK and outputs a plurality of shifted read commands RD1 to RDN. The selection unit 252B_1 selects any one of the plurality of shifted read commands RD1 to RDN according to the CAS latency information CL. The activation width expansion unit 252B_3 expands the activation width of the read command RDSHIFT selected by the selection unit 252B_1 according to the burst length information BL4 and BL8 and outputs the expanded signal as the jitter determination reference control signal DRVEN.

In such a state, when the comparison signal PDOUT is activated to a logic high level, the sampling unit 254A samples the comparison signal PDOUT five times, and the jitter determination unit 254B activates the filtered comparison signal INC to a logic high level at a time point T2 when the fifth period (5tCK) of the control clock signal CTRLCLK begins after the comparison signal PDOUT is activated according to the sampling result of the sampling unit 254A. The sampling operation may be described in more detail as follows. The second shifting unit 254A_1 successively shifts the comparison signal PDOUT in synchronization with the control clock signal CTRLCLK, and generates the first to fifth shifted comparison signals A to E. At this time, the blocking unit 254_3 outputs the fourth and fifth shifted comparison signals D and E in response to the jitter determination reference control signal DRVEN at a logic high level. Accordingly, the jitter determination unit 254B activates the filtered comparison signals INC and DEC only when all of the first to fifth shifted comparison signals A to E are at a logic high level.

As a result, since the jitter determination reference control signal DRVEN is activated to a logic high level in the read operation mode M2, the jitter determination reference is set to five periods (5tCK) of the control clock signal CTRLCLK, and the comparison signal PDOUT is recognized as a normal comparison signal, only when the activation state of the comparison signal PDOUT is maintained for five periods (5tCK) of the control clock signal CTRLCLK.

Therefore, as the sampling number is set to five in the read operation mode M2, the operation may be stably performed regardless of a jitter occurring during the tracking operation (or update operation) of the DLL 200.

Figure 8:
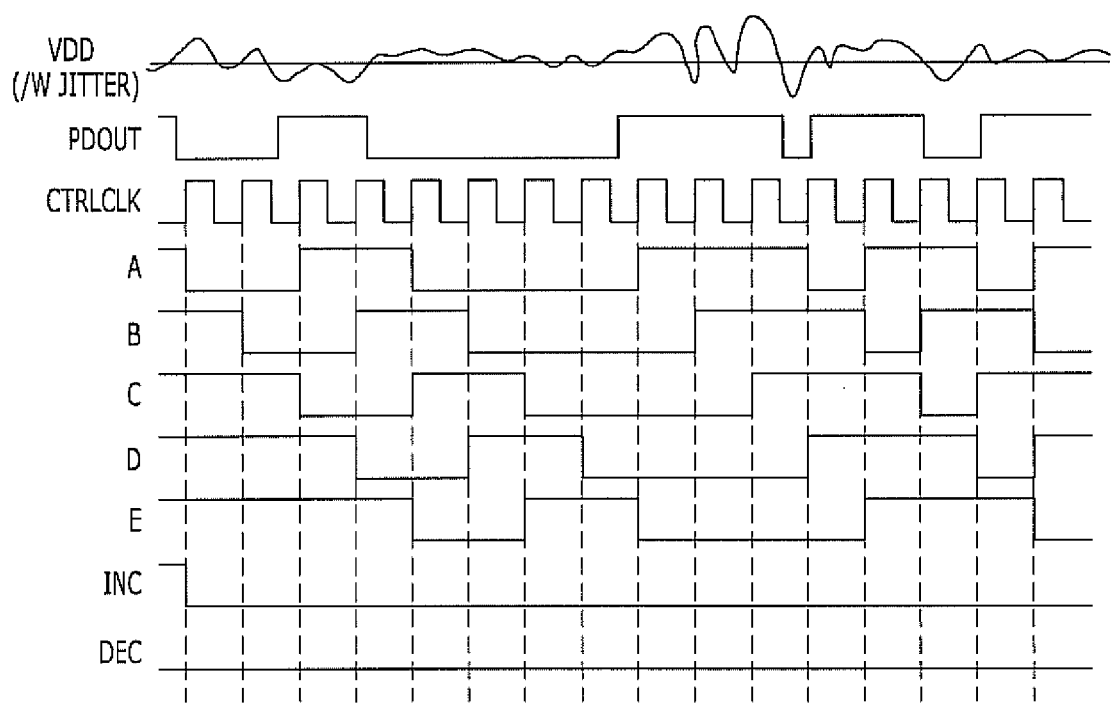

FIG. 8 is a timing diagram showing that the jitter determination ability is improved in the read operation mode M2.

Referring to FIG. 8, when the power supply voltage VDD does not maintain a target level but fluctuates as a jitter is introduced into the power supply voltage VDD, the comparison signal PDOUT is activated to a logic high level. However, since the activated comparison signal PDOUT is filtered by the filtering circuit 250, the filtered comparison signals INC and DEC are not activated. The filtered comparison signals INC and DEC are not activated because the activation unit of the comparison signal PDOUT is not maintained during five periods (5tCK) of the control clock signal CTRLCLK. More specifically, a unit where all of the first to fifth shifted comparison signals A to E are at a logic high level (or logic low level) does not exist.

Therefore, although the comparison signal PDOUT is undesirably activated by a jitter, the tracking operation (or update operation) of the DLL 200 is not incorrectly performed.

Figure 9:
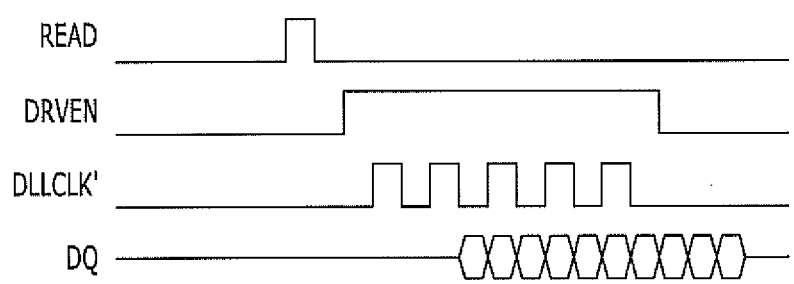
FIG. 9 is a timing diagram illustrating an operation where a delay locked clock signal outputted from the DLL of FIG. 4 is selectively outputted.

FIG. 9 is a timing diagram illustrating a process where the delay locked clock signal DLLCLK is outputted according to the read operation mode M2.

Referring to FIG. 9, when the read command RD is applied when the delay locked clock signal DLLCLK is locked, the jitter determination reference control signal DRVEN is activated during a designated period. The designated period is decided according to the CAS latency information CL and the burst length information BL4 and BL8.

Subsequently, the output driver 270 drives the delay locked clock signal DLLCLK only during a period where the jitter determination reference control signal DRVEN is activated and outputs the driven delay locked clock signal DLLCLK'.

Accordingly, the data output unit 280 outputs data RDATA and FDATA to the data pad DQ in synchronization with the driven delay locked clock signal DLLCLK'.

In accordance with the embodiment of the present invention, the sampling number may be increased to improve the jitter determination ability, in the read operation mode. Furthermore, in operation modes other than the read operation mode, the sampling number may be reduced to shorten the tracking period (or update period) of the DLL.

While the present invention has been described with respect to the specific embodiments, various changes and modifications may be made without departing from the spirit and scope of the invention as defined in the following claims.

In the embodiment of the present invention, the read operation mode has been taken as an example for description. Without being limited thereto, however, the present invention may be applied to an operation mode where a very large voltage drop occurs inside a semiconductor integrated circuit, like an auto refresh operation mode.

Furthermore, it has been described that the sampling number is controlled to five or three, depending on operation modes. Without being limited thereto, however, the sampling number may be controlled differently depending on operation environment, performance, and design.

What is claimed is:

1. A filtering circuit of an integrated circuit, the filtering circuit comprising:
   a jitter determination reference control unit configured to determine a jitter determination reference in correspondence to an operation mode and output a control signal in response to the jitter determination reference; and
   a filtering unit in a delayed lock loop (DLL) of the integrated circuit, the filtering unit configured to:
      set the jitter determination reference in response to the control signal, and
      determine whether an input signal is maintained during a sample period in response to the set jitter determination reference.

2. The filtering circuit of claim 1, wherein the jitter determination reference control unit is configured to activate the control signal during a reference period in a read operation mode.

3. The filtering circuit of claim 2, wherein the reference period is decided according to a read command, a clock signal, CAS latency information, and burst length information.

4. The filtering circuit of claim 2, wherein the jitter determination reference is set to a reference period longer in the read operation mode than in operation modes other than the read operation mode.

5. The filtering circuit of claim 1, wherein the jitter determination reference control unit is configured to activate the control signal during a reference period in an auto refresh operation mode.

6. The filtering circuit of claim 5, wherein the jitter determination reference is set to a reference period longer in the auto refresh operation mode than in operation modes other than the auto refresh operation mode.

7. A semiconductor integrated circuit comprising:
   a variable delay line configured to delay a source clock signal by a delay time for locking in response to a first control signal and output a delay locked clock signal;
   a replica delay unit configured to delay the delay locked clock signal by a delay time occurring in a clock path and output a feedback clock signal;
   a phase comparator configured to compare phases of the source clock signal and the feedback clock signal and output a comparison signal;
   a filtering circuit configured to determine whether the comparison signal is maintained during a sample period in response to a jitter determination reference that corresponds to an operation mode; and
   a first control unit configured to generate the first control signal in response to the comparison signal filtered by the filtering circuit.

8. The semiconductor integrated circuit of claim 7, wherein the filtering circuit comprises:
   a jitter determination reference control unit configured to determine the jitter determination reference according to an operation mode and output a control signal in response to the jitter determination reference; and
   a filtering unit configured to set the jitter determination reference in response to the second control signal and determine whether the comparison signal is maintained during a sample period in response to the set jitter determination reference.

9. The semiconductor integrated circuit of claim 8, wherein the jitter determination reference control unit is configured to activate the second control signal during a reference period in a read operation mode.

10. The semiconductor integrated circuit of claim 8, wherein the jitter determination reference control unit comprises:
   a first shifting unit configured to generate a plurality of shifted read commands in response to a read command and a clock signal; and
   a control signal generation unit configured to generate the second control signal in response to the plurality of shifted read commands, a clock signal, CAS latency information, and burst length information.

11. The semiconductor integrated circuit of claim 10, wherein the first shifting unit comprises a plurality of connected D flip-flops.

12. The semiconductor integrated circuit of claim 10, wherein the control signal generation unit comprises:
   a selection unit configured to select and output any one of the plurality of shifted read commands in response to the CAS latency information; and
   an activation width expansion unit configured to generate an expanded signal by expanding an activation time of the shifted read command selected by the selection unit in response to the burst length information and the clock signal and output the expanded signal as the second control signal.

13. The semiconductor integrated circuit of claim 9, wherein the filtering unit comprises:
   a sampling unit configured to sample the comparison signal by the sampling period corresponding to the jitter determination reference for each operation mode in response to the second control signal; and
   a jitter determination unit configured to determine whether the comparison signal is a jitter according to an output signal of the sampling unit and generate the filtered comparison signal.

14. The semiconductor integrated circuit of claim 13, wherein the sampling period is increased in the read operation mode than in operation modes other than the read operation mode.

15. The semiconductor integrated circuit of claim 13, wherein the sampling unit comprises:
   a second shifting unit configured to generate a plurality of shifted comparison signals that are sequentially outputted in response to the comparison signal and a clock signal; and
   a blocking unit configured to selectively block shifted comparison signals that are outputted among the plurality of shifted comparison signals in response to the second control signal.

16. The semiconductor integrated circuit of claim 15, wherein the blocking unit comprises at least one multiplexer configured to selectively output any one of the outputted shifted comparison signals and a blocking signal fixed at a voltage level in response to the second control signal.

17. The semiconductor integrated circuit of claim 16, wherein the jitter determination unit is configured to perform a logical operation on the comparison signals other than the blocked shifted comparison signals and an output signal of the blocking unit and output the filtered comparison signal.

18. The semiconductor integrated circuit of claim 9, further comprising an output driver configured to selectively output the delay locked clock signal in response to the second control signal.

* * * * *